(12) United States Patent
Abu Qahouq (10) Patent No.: US 9,590,514 B1
(45) Date of Patent: Mar. 7, 2017

(54) CARBON NANOTUBE-BASED INTEGRATED POWER CONVERTERS

(71) Applicant: Jaber A. Abu Qahouq, Tuscaloosa, AL (US)

(72) Inventor: Jaber A. Abu Qahouq, Tuscaloosa, AL (US)

(73) Assignee: The Board of Trustees of the University of Alabama, for and on behalf of the University of Alabama, Tuscaloosa, AL (US)

(*) Notice: Subject to any disclaimer, the term of this patent is extended or adjusted under 35 U.S.C. 154(b) by 155 days.

(21) Appl. No.: 14/217,308

(22) Filed: Mar. 17, 2014

Related U.S. Application Data (60) Provisional application No. 61/794,087, filed on Mar. 15, 2013.

(51) Int. Cl.
*H02M 3/158* (2006.01)
*H02M 3/335* (2006.01)

(52) U.S. Cl.
CPC ............. *H02M 3/33546* (2013.01)

(58) Field of Classification Search
CPC ........ H01L 2924/13091; H01L 2924/130107; H02M 3/158; H02M 3/1588; H02M 3/33569
USPC ............. 323/271, 282, 351; 363/17, 147
See application file for complete search history.

(56) References Cited

U.S. PATENT DOCUMENTS

| | | | |
|---|---|---|---|
| 5,111,169 A | 5/1992 | Ikeda | |
| 5,557,138 A | 9/1996 | Ikeda | |
| 5,793,272 A | 8/1998 | Burghartz et al. | |
| 6,417,755 B1 | 7/2002 | Liu et al. | |
| 7,494,910 B2 | 2/2009 | Mouli | |
| 7,671,714 B2 | 3/2010 | Tiemeijer | |
| 7,795,725 B2 | 9/2010 | Mouli | |
| 2002/0003463 A1 | 1/2002 | Shin et al. | |
| 2002/0113335 A1* | 8/2002 | Lobovsky ............ | B82Y 30/00 264/184 |
| 2003/0142520 A1* | 7/2003 | Kimura ................ | H02M 7/538 363/100 |
| 2003/0165648 A1* | 9/2003 | Lobovsky ............ | B82Y 30/00 428/36.9 |
| 2004/0130415 A1 | 7/2004 | Chiba | |
| 2005/0057189 A1* | 3/2005 | Kimura ................ | G05F 3/242 315/291 |
| 2005/0110473 A1* | 5/2005 | Mitsuo ................. | H03K 4/06 323/271 |

(Continued)

OTHER PUBLICATIONS

Abu Qahouq, et al., U.S. Appl. No. 13/464,783 "Carbon Nanotube-Based Integrated Power Inductor for On-Chip Switching Power Converters," filed on May 4, 2012.

*Primary Examiner* — Jeffrey Sterrett
(74) *Attorney, Agent, or Firm* — Maynard Cooper & Gale, P.C.; Jon E. Holland (57) ABSTRACT

A substrate having trenches containing carbon nanotubes has elements to provide a power converter. One set of trenches is configured to form an inductor and another set is configured to form a capacitor. Trenches in the substrate are also configured to receive semiconductor material and carbon nanotubes to form a power field effect transistor. All the elements are coupled together using carbon nanotubes placed in connection trenches of the substrate.

14 Claims, 9 Drawing Sheets

(56) References Cited

U.S. PATENT DOCUMENTS

| | | | |
|---|---|---|---|
| 2005/0162206 A1* | 7/2005 | Kimura | G09G 3/3283 327/203 |
| 2005/0275497 A1 | 12/2005 | Ramadan | |
| 2007/0018190 A1 | 1/2007 | Kim et al. | |
| 2007/0243124 A1* | 10/2007 | Baughman | B82Y 30/00 423/447.1 |
| 2008/0122439 A1 | 5/2008 | Burdick | |
| 2008/0122567 A1 | 5/2008 | Su | |
| 2008/0170982 A1* | 7/2008 | Zhang | B82Y 10/00 423/447.3 |
| 2008/0283267 A1 | 11/2008 | Werth | |
| 2009/0014767 A1 | 1/2009 | Furukawa et al. | |
| 2009/0027372 A1* | 1/2009 | Shishido | G01J 1/02 345/207 |
| 2009/0315662 A1 | 12/2009 | Hijioka et al. | |
| 2010/0066325 A1* | 3/2010 | Shionoiri | G06K 19/0701 323/282 |
| 2010/0303722 A1 | 12/2010 | Jin et al. | |
| 2011/0101933 A1* | 5/2011 | Lopata | H02M 3/1588 323/271 |
| 2011/0286144 A1 | 11/2011 | Ikriannikov | |
| 2012/0244802 A1 | 9/2012 | Feng | |
| 2013/0168598 A1* | 7/2013 | Xiong | C08K 9/08 252/62.54 |
| 2013/0221937 A1* | 8/2013 | Yan | G05F 1/565 323/271 |

* cited by examiner

CARBON NANOTUBE-BASED INTEGRATED POWER CONVERTERS

CROSS REFERENCE TO RELATED APPLICATION

This application claims priority to U.S. Provisional Patent Application No. 61/794,087, entitled "Carbon Nanotube-Based Integrated Power Converters" and filed on Mar. 15, 2013, which is incorporated herein by reference.

BACKGROUND

Power converters are indispensable devices in electrical platforms and systems such as computing platforms, communication and mobile systems, medical systems, electric vehicles, military systems, renewable energy systems, aerospace systems, and almost all peripherals and devices. These systems and related applications impact people's daily life. New technology for power electronics and power converters is critical for achieving higher energy efficiency and significant cost reduction and size.

Power converters convert voltage or current from one level to another and/or from one form to another in order to supply energy to a specific load. Such power converters are of several types, such as DC-DC power converters, AC-DC power converters, DC-AC power inverters, and AC-AC power inverters.

Switching DC-DC power converters have the advantage of much higher energy efficiency as compared with converters using linear regulators. However, the switching DC-DC power converter is generally larger than the linear regulator converter primarily because it typically requires power inductors, power transformers, more switching power devices and control circuits. Nonetheless, the switching DC-DC power converters are widely used especially when the energy efficiency is crucial.

In general, the integration and size reduction of other technologies, such as Integrated Circuits (ICs) for microprocessors and other general purpose processors (e.g., graphic ICs and communications ICs), are advancing at a faster pace than switching power converter technologies. Integrating power converters "on chip" yields several advantages such as smaller size, lighter weight, reduced distribution, reduced distribution losses, and potentially reduced EMI (Electromagnetic Interference).

When the dimensions of solid materials are reduced to nanometer size, the materials often exhibit new and interesting behavior which can constitute the basis for a new generation of electronic devices. Hence, nanotechnology helps to achieve reliable nanometer-scale power devices with small footprints and reduced power consumptions. Consequently, there is a need to develop new nanotechnology-based power devices that can result in transformative advances.

A DC-DC switching power converter typically comprises switching power devices such as MOSFETs (Metal Oxide Field Effect Transistor), analog and/or digital control circuits filter capacitors, power inductors, and sometimes power transformers. Switching power devices and control circuits can be easily integrated on a single chip, but the power inductors, transformers and capacitors are often bulky and difficult to integrate with other components. In most cases, such off-chip components are an obstacle for reducing the size of switching power converters.

For many electronic systems, it is desirable to develop integrated DC-DC power converters for System on Chip (SoC) applications. The most common approaches to integrate power converters include: Power System in Package (PSiP) and Power System on Chip (PSoC). PSiP uses off-the-shelf components in order to supply large power requirements, but such components often limit size reduction. PSoC often integrates components, such as power inductors and capacitors, directly on IC (Integrated Circuit) chips. Such an approach can minimize size by taking advantages of known micro-fabrication technologies. Carbon nanotubes (CNTs) at the nanometer scale have sometimes been used to form electrical components. However, there are interfacial resistance problems associated with conventional connectors, such as copper traces on a substrate, that are often used to couple CNT components of a converter.

Therefore, if the connection problem can be diminished or removed, it appears to be advantageous to replace conventional technology with nanotechnology to achieve reliable nanometer-scale power devices with smaller footprints and less power consumption. Scaling the components to nanometer size helps to reduce converter size. Nanotechnolgy power components would provide for high-density on-chip integration of the power converters resulting in optimum power management, elimination of discrete component, smaller footprint, lower distribution losses, and lower parasitic delays.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

Figure 1:
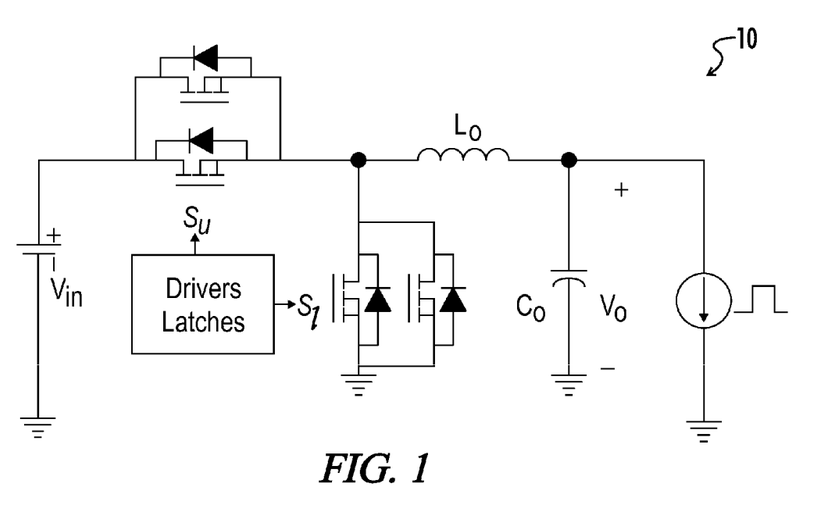
FIG. 1 is a circuit diagram illustrating a single-phase switching converter.

A circuit for a DC-DC switching power converter 10 is depicted in FIG. 1 in a single-phase topology. The input to the converter 10 is a DC voltage source $V_{in}$. Switches, $S_u$ and $S_l$, of the converter 10 are controlled by signals from a controller. A power inductor, $L_o$, and a capacitor, $C_o$, are energy storage components of the converter 10. Switching converter 10 is often used for supplying power in hand-held and other small devices. It is therefore desirable for the converter 10 to be as small as possible. Inductors, such as Lo, and capacitors, such as $C_o$, typically account for a significant portion of the board space on a printed circuit board or substrate where components of the converter are mounted. Hence, one way to significantly reduce the size of a converter is to reduce the size of such components. Exemplary embodiments of power inductors and transformers are described in commonly-assigned U.S. patent application Ser. No. 13/464,783, entitled "Carbon Nanotube-Based Integrated Power Inductor for On-Chip Switching Power Converters" and filed on May 4, 2012, which is incorporated herein by reference. Embodiments of other carbon nanotube (CNT) components for other converter components, formed by novel CNT structures, are described herein. Such embodiments of components are based on trenches having a variety of structures that are formed in a substrate. In addition connections between the components are provided by CNT couplings that eliminate converter efficiency loss caused by interfacial resistance. The CNTs in these devices (e.g., power interconnects, $L_o$, $C_o$, $S_u$ and $S_l$) may be fabricated by variety of methods, such as inside trenches in a substrate or directly on the substrate surface. There are a variety of substrate types that could be used. Moreover, several of each of these devices (e.g., power interconnects, $L_o$, $C_o$, $S_u$ and $S_l$) could be connected in parallel and in series.

Figure 2:
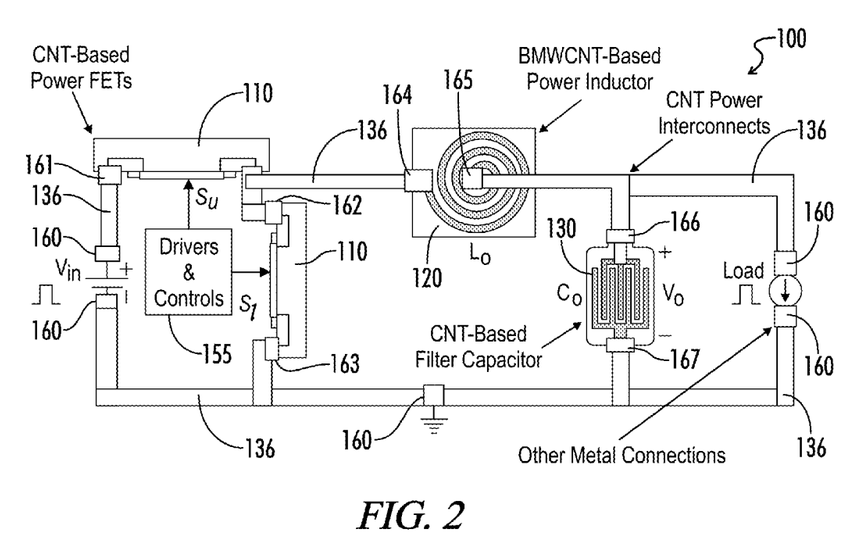
FIG. 2 depicts an exemplary embodiment of a single-phase switching converter having components and connections comprising various arrangements of carbon nanotubes in accordance with the present disclosure.

An exemplary converter 100 having single-phase power converter configuration and comprising carbon nanotube (CNT) components and connections is depicted in FIG. 2. An input voltage, $V_{in}$, is coupled to the converter 100 via a pair of metallic terminals 160, such as a copper terminal, a mixture of conductive, non-CNT material (e.g., copper) and CNT, or a mixture of other nano-structures/materials and/or other type of structures/materials, that is in electrical communication with CNT conductors 136. As an example, a power supply (not shown) may have metallic (e.g., copper) leads that are respectively coupled to the terminals 160 in order to apply $V_{in}$ to the terminals 160 so that current flows through the circuit shown by FIG. 2.

Each CNT conductor 136 is composed of CNTs that may be formed in a trench of or deposited on a surface of one or more substrates forming a conductive trace for carrying current. As an example, CNT-based components, such as CNT-based FETs 110, a CNT-based inductor 120, and a CNT-based capacitor 130 may be formed on a substrate, and CNT conductors 136 may be formed in trenches of the substrate and used to interconnect the CNT-based components.

In particular, one of the CNT conductors 136 couples one terminal 160 of the input voltage to an input terminal 161 of a first CNT-based power field effect transistor (FET), $S_u$ 110, and the other CNT conductor 136 couples the other terminal 160 of the input voltage to ground. In one exemplary embodiment, each terminal 160 is composed of a mixture of CNTs and a conductive material, such as copper, but other configurations of the terminals 160 are possible. The output side of $S_u$ 110 is coupled, via another CNT conductor 136, to a first terminal 162 of a second CNT-based power FET, $S_l$ 110. A second terminal 163 of $S_l$ 110 is connected to ground via a CNT conductor 136. The FETs, $S_u$ and $S_l$, are controlled by controller (having driver and control circuits) 155.

In one embodiment, the driver and control circuits 155 are provided by conventional technology circuits. In another embodiment, the driver and control circuits 155 are fabricated using CNT components and may be combined with the other CNT components of the converter 100.

Figure 8A:
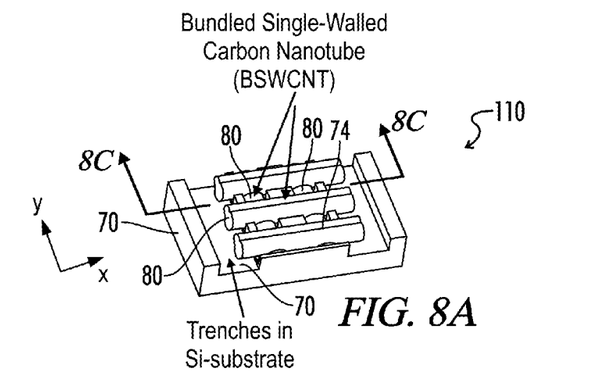
FIG. 8A depicts an embodiment of a carbon nanotube FET in accordance with the present disclosure with insulating and semiconductive material removed for simplicity of illustration.
Figure 9:
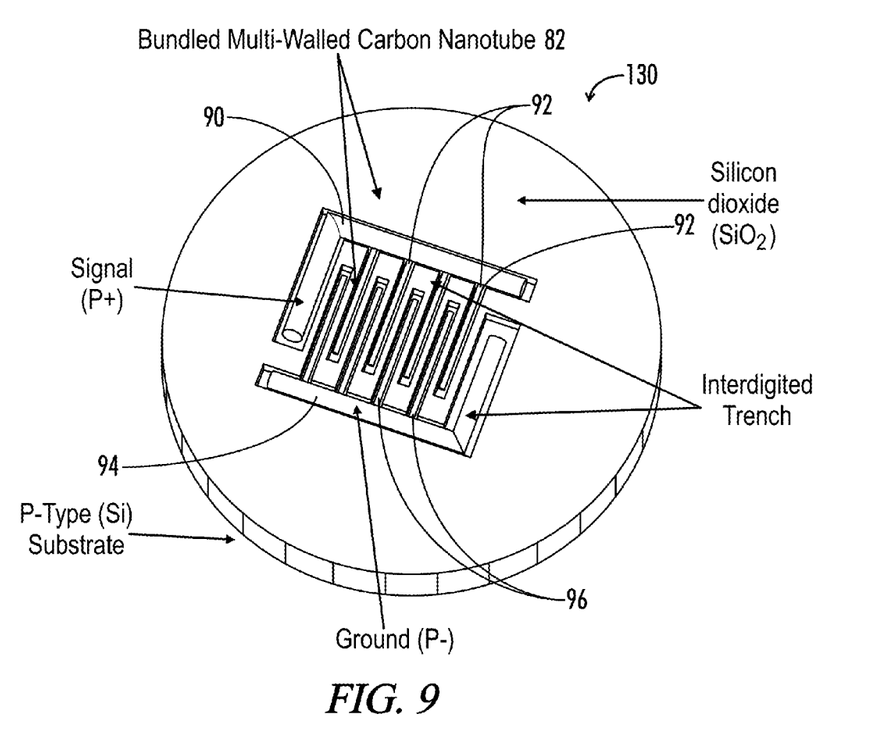
FIG. 9 depicts an embodiment of a carbon nanotube capacitor in accordance with the present disclosure.

The CNT-based FETs 110, $S_u$ and $S_l$ of FIG. 2 are configured to respond to signals from controller 155 to provide a time-varying voltage to a terminal 164 of CNT-based inductor 120. The other terminal 165 of CNT-based inductor 120 is connected to a terminal 166 of a CNT-based capacitor 130 via a CNT conductor 136. Another terminal 167 of the CNT-based capacitor 130 is connected to ground via a CNT conductor 136. The CNT-based inductor 120 and CNT-based capacitor 130 are configured to exchange energy in order to maintain output voltage, $V_o$. The output voltage of converter 100 has an output value that remains within a specified range of voltages, such as, e.g., 5 volts, plus or minus one percent. The output voltage, $V_o$, is available to supply energy to a load via output terminals 160. Details of an exemplary CNT-based FET 110 are depicted in FIG. 8, and details of an exemplary a CNT-based capacitor 120 are depicted in FIG. 9.

In one exemplary embodiment, a CNT conductor 136 is provided when one or more CNTs, such as Bundled Single-Walled CNTs are placed, via a fabrication process, in trenches or on surface of a substrate. Further, the substrate can have trenches with a variety of shapes that contain CNTs, coated CNTs, and other materials to provide all or most of the components for converter 100. The CNT-based power devices could also be fabricated in a three dimensional stacked layers manner (vertically) and connected by CNT power conductors through vias (holes between the different layers).

Figure 3:
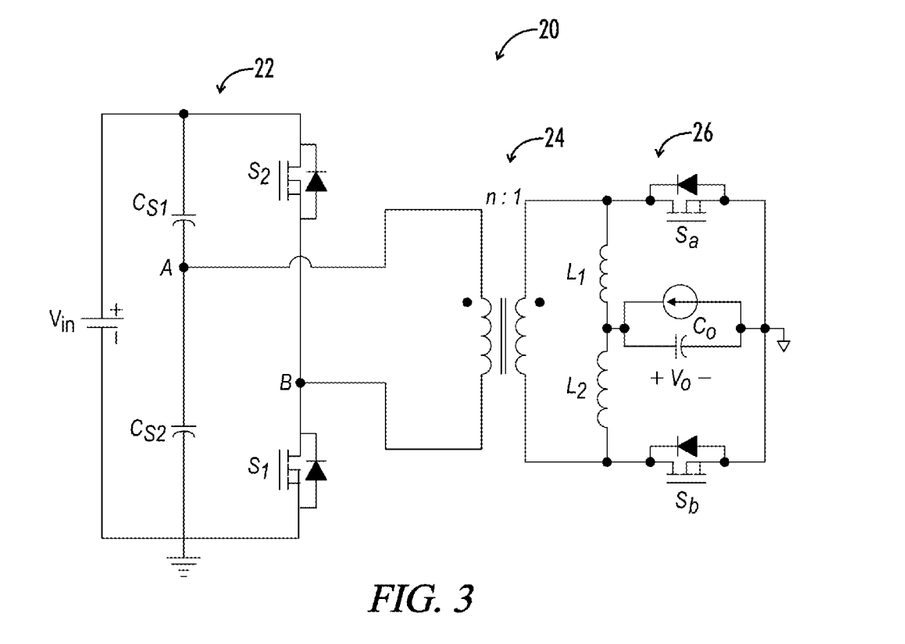
FIG. 3 is a circuit diagram illustrating a half-bridge switching converter.

FIG. 3 depicts a typical schematic for a conventional half-bridge power converter 20 with a current-doubler secondary side. The converter 20 comprising an AC generator 22, a transformer 24, and output module 26 converts an input voltage to an output voltage. Input voltage, $V_{in}$, is applied to FETs $S_1$ and $S_2$. The FETs, $S_1$ and $S_2$, are configured to cooperate with input capacitors $C_{S1}$ and $C_{S2}$ to generate an alternating voltage. The FETs $S_1$ and $S_2$ receive control signals from a controller (not shown) that causes such cooperative action. The voltage across terminal A and terminal B of AC generator 22 is applied to a primary winding of transformer 24. The output of transformer 24 is applied across the series arrangement of inductors $L_1$ and $L_2$. An output capacitor, Co, has one terminal coupled between the junction of $L_1$ and $L_2$ and another terminal coupled to electrical ground. The voltage across $C_o$ is the output voltage, $V_o$. The FETs, $S_a$ and $S_b$, of the output module 26 provide for energy transfers between the inductors $L_1$, $L_2$, and capacitor, $C_o$. Those skilled in the art would generally understand the operation of converter 20.

Figure 4:
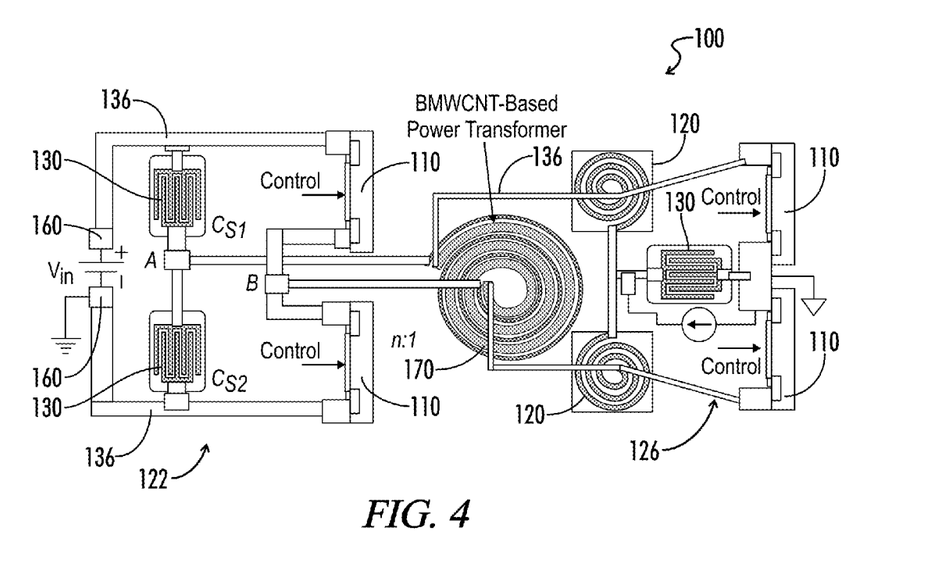
FIG. 4 depicts an exemplary embodiment of the switching converter of FIG. 3 having components and connections comprising various arrangements of carbon nanotubes in accordance with the present disclosure.

FIG. 4 depicts an exemplary embodiment of a converter 100 providing the function as described for current-doubler converter 20 of FIG. 3. Converter 100 comprising AC generator 122, transformer 170, and output module 126 provides output voltage, $V_o$, in response to input voltage, $V_{in}$. The input voltage, $V_{in}$, is applied to terminals 160 and that input voltage is coupled via CNT conductors 136 to CNT-based capacitors 130, $C_{S1}$ and $C_{S2}$ and to CNT-based FETs 110. The capacitors 130 and FETs 110 operate cooperatively (based on a control signal) to provide an alternating voltage. The alternating voltage is carried by CNT conductors 136 that are coupled to the CNT-based transformer 170. Detailed descriptions of CNT-based inductors and CNT-based transformers are described in commonly-assigned U.S. patent application Ser. No. 13/464,783, entitled "Carbon Nanotube-Based Integrated Power Inductor for On-Chip Switching Power Converters" and filed on May 4, 2012, which is incorporated herein by reference. The voltage across the output terminals of transformer 170 is applied to output module 126 via CNT conductors 136. Output module 126 has CNT-based FETs 110 coupled to CNT-based inductors 120. The output voltage, $V_o$, is available across output capacitor $C_o$.

Figure 5:
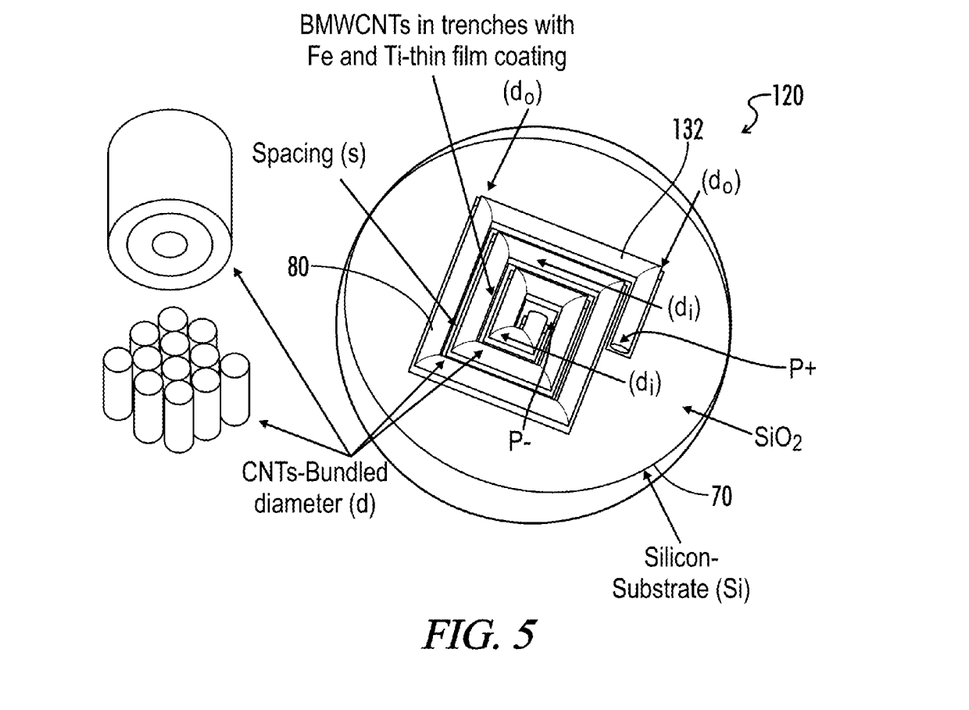
FIG. 5 depicts an exemplary carbon nanotube inductor for the converters of FIG. 2 and FIG. 4.
Figure 6A:
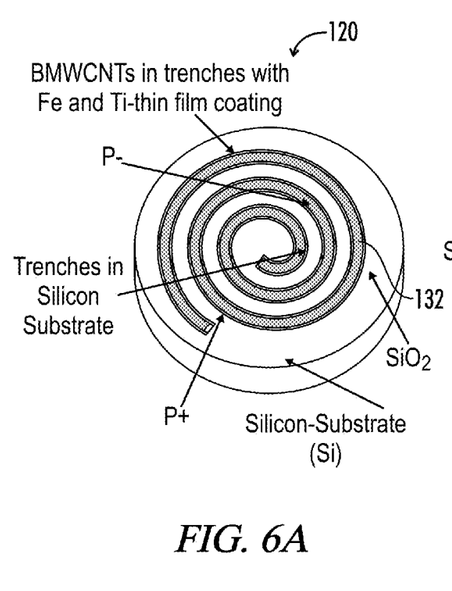
FIG. 6A depicts another exemplary carbon nanotube inductor for the converters of FIG. 2 and FIG. 4.
Figure 7:
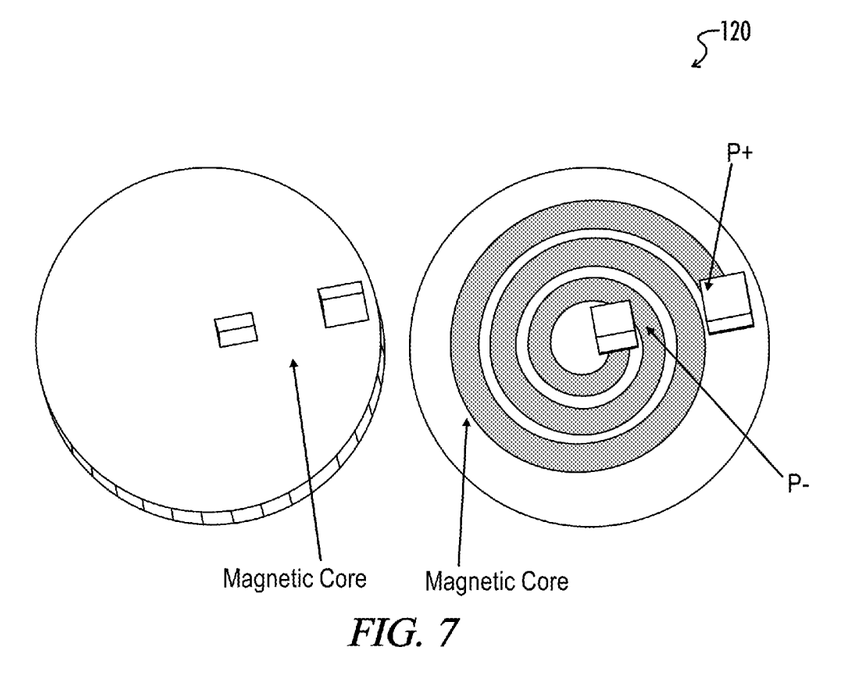
FIG. 7 depicts exemplary disk-shaped magnetic cores that may be placed on each side of a substrate of an inductor or transformer.

FIGS. 5, 6 and 7 depict inductive devices, inductors and a transformer that are described in further detail U.S. application Ser. No. 13/464,783. The figures are provided to illustrate the structure of exemplary embodiments of inductive devices. FIG. 5 depicts a CNT-based inductor 120 comprising a substrate 70 having a trench 80 with a square-spiral shape. Formed within the trench 80 is a conductive CNT coil 132. Ends of the CNT coil 132 serve as terminals that may be coupled to CNT conductors 136 for connecting to other components of a CNT-based converter or other device. FIG. 6A depicts an inductor 120 having a round-spiral shape and is formed in way similar to that of FIG. 5. In one exemplary embodiment, an end 134 of the CNT coil 132 of the inductor 120 shown by FIG. 6A is coupled to terminal 164 shown by FIG. 2, and an opposite end 135 of the CNT coil 132 (around which the coil 132 spirals) is coupled to the terminal 165 shown by FIG. 2.

Figure 6B:
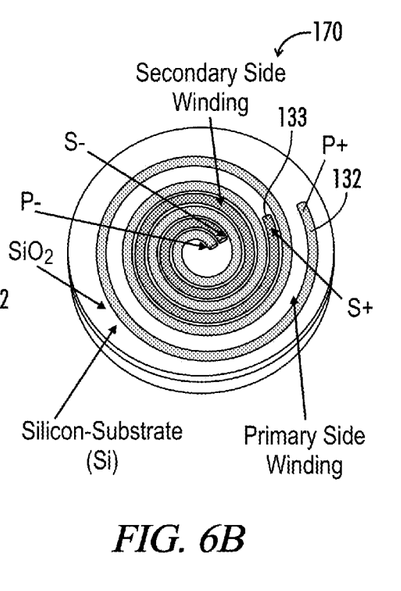
FIG. 6B depicts an exemplary carbon nanotube transformer for the converter of FIG. 4.

FIG. 6B depicts a transformer 170 that is provided by placing two CNT coils 132 and 133 in two spirally-shaped trenches, respectively (e.g., one trench for each coil) or within a single spirally-shaped trench large enough to accommodate both coils 132 and 133. The two CNT coils 132 and 133 are electrically separated from each other. Such electrical separation may be provided by coating one of the coils with an insulating material. Energy is coupled between the coils of CNT 132 of the transformer 170 via transformer action (electromagnetic coupling). The performance of inductors and transformers may be enhanced by placing magnetic material on each side of their respective substrates as depicted in FIG. 7.

Figure 8B:
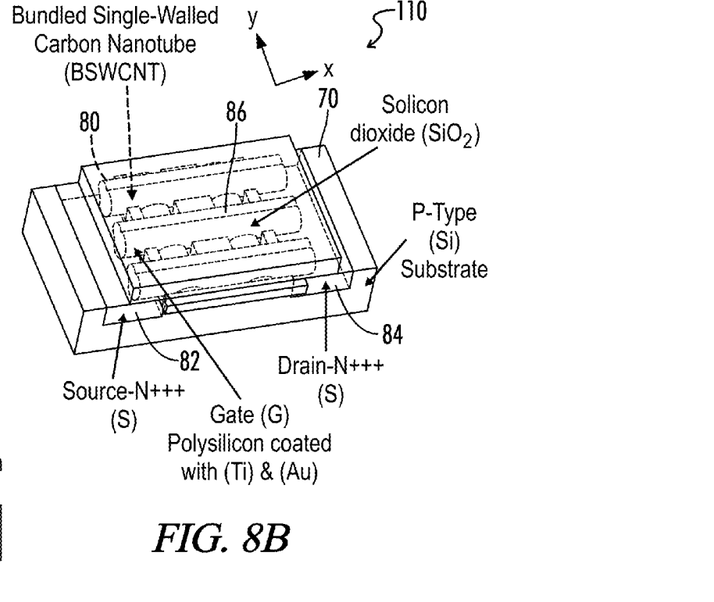
FIG. 8B depicts the carbon nanotube FET of FIG. 8A with the insulating and semiconductive material shown.

FIGS. 8A and 8B depict an exemplary embodiment of a CNT-based FET 110 in accordance with the present disclosure. FIG. 8A shows a partially fabricated CNT-based FET 110. The partially fabricated CNT-based FET 110 comprising a substrate 70 with trenches 72 defined by surfaces of the substrate are configured to receive semiconductor material for providing a drain 84 and source 82 for FET 110. In addition there are trenches 74 for a plurality of CNT structures 80 composed of CNTs, each CNT structure 80 having a generally cylindrical shape with its longitudinal axis extending in the y direction. Another plurality of CNT structures 86 composed of CNT is fabricated so that each CNT structure 86 is generally cylindrical with its longitudinal axis extending in the x direction. Note that other shapes of the structures 80 and 86 are possible.

Figure 8C:
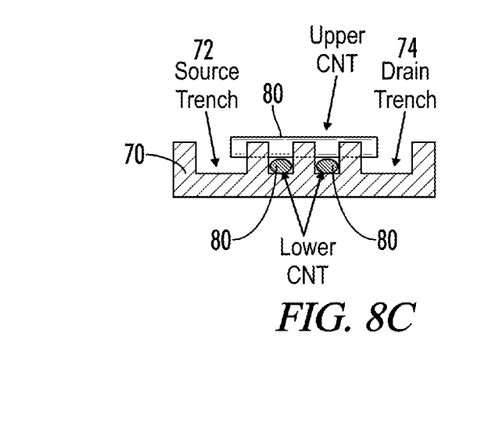
FIG. 8C depicts a cross-sectional view of the carbon nanotube depicted by FIG. 8A.

As depicted in FIGS. 8B and 8C, the CNT structures 86 are positioned above the CNT structures 80, and an insulator 88 covers the structures 86. The source 82 and drain 84 for the CNT-based FET 110 are provided by inserting N++ material in trenches in the substrate 70. The CNT structures 86 are p-type semiconductors that form a gate for physically connecting the source 82 and drain 84. The upper CNT structures 80 contact the lower CNT structures 86 to form a crossover type connection. That is, lower CNT structures 86 form a conductor for carrying a gate signal and applying the gate signal to the upper CNT structures 86 for controlling a conductivity of the upper CNT structures 86, thereby controlling the amount of current that flows via the upper CNT structures 86 between the source 82 and drain 84.

FIG. 9 depicts an embodiment of a CNT-based capacitor 120 in accordance with the present disclosure. The CNT-based capacitor 120 comprising a first CNT conductor 90 having an L-shape in a trench of a substrate and a second CNT conductor 94 having an L-shape in another trench of the substrate are configured for connecting to other CNT components of converter 100. The first CNT conductor 90 has fingers 92 of CNT material in trenches that are perpendicular to the long arm of the L-shape. The second CNT conductor 94 has fingers 96 of CNT material that are perpendicular to the long arm of the L-shape. The fingers 92, 96 are configured so that they are interlocked, but the fingers of the first and second conductors do not touch. That is, the fingers 92, 96 are formed such that a finger 92 of conductor 90 is positioned between fingers 96 of conductor 94 and vice versa. The interlocked fingers 92, 96 are dimensioned such that their edges are close to each other in order to provide capacitance between the first CNT conductor 90 and the second CNT conductor 94. In one embodiment the fingers 92, 96 of the CNT conductors 90, 94 are coated with a dielectric material. Other geometries are possible to provide a CNT-based capacitor that serves as an element of converter 100.

Exemplary embodiments of converters 100 have been described in FIG. 2 and FIG. 4, other types of switched converters, inverters and devices may benefit from the innovations described above. For example, a variety of small form factor devices, such as modulators and amplifiers, may be fabricated using all or some of the CNT-based components described herein above. The improved connections between CNT-based components of a device using CNT-based conductors 136 increases the device energy efficiency, thereby reducing power requirements of a device. The CNT-based devices may use a variety of types of CNTs.

Now, therefore, the following is claimed:

1. A power converter, comprising:
   input terminals configured to receive an input voltage;
   a carbon nanotube-based (CNT-based) field effect transistor coupled to the input terminals via a first CNT conductor composed of carbon nanotubes (CNTs);
   a CNT-based inductor composed of CNTs within a coil-shaped trench of a substrate, the inductor conductively coupled to the CNT-based FET via a second CNT conductor composed of CNTs;
   a CNT-based capacitor having a plurality of conductors composed of CNTs, the CNT-based capacitor conductively coupled to the CNT-based inductor via a third CNT conductor composed of CNTs; and
   output terminals conductively coupled to the CNT-based capacitor,
   wherein the power converter is configured to control an output voltage across the output terminals based on the input voltage.

2. The power converter of claim 1, wherein at least one of the input terminals is composed of CNTs mixed with a conductive material.

3. The power converter of claim 2, wherein the conductive material is copper.

4. The power converter of claim 1, wherein the CNT-based FET has a source, a drain, and a gate, the gate comprising a first CNT structure composed of CNTs.

5. The power converter of claim 4, wherein the first CNT structure contacts a second CNT structure composed of CNTs, thereby forming a crossover connection for applying a gate signal from the second CNT structure to the first CNT structure.

6. The power converter of claim 1, wherein the coil-shaped trench has a magnetic core.

7. The converter of claim 1, wherein the plurality of conductors of the CNT-based capacitor includes a first conductor having first CNT fingers composed of CNTs, wherein the plurality of conductors of the CNT-based capacitor includes a second conductor having second CNT fingers composed of CNTs, and wherein at least one of the first CNT fingers is positioned between a pair of the second CNT fingers.

8. The power converter of claim 1, further comprising a CNT-based transformer conductively coupled to the CNT-based inductor and the CNT-based FET, wherein the CNT-based transformer has a first coil composed of CNTs and a second coil composed of CNTs.

9. A power conversion method, comprising:
receiving an input voltage via a carbon nanotube-based (CNT-based) field effect transistor (FET);
maintaining currents via a CNT-based inductor in response to an output of the CNT-based FET, the CNT-based inductor composed of CNTs within a trench of a substrate;
maintaining a desired voltage across output terminals via a CNT-based capacitor in response to the currents maintained by the CNT-based inductor, the CNT-based capacitor having a plurality of conductors composed of CNTs,
wherein the CNT-based inductor is conductively coupled to the CNT-based FET via a first CNT conductor composed of CNTs, wherein the CNT-based capacitor is conductively coupled to the CNT-based inductor via a second CNT conductor composed of CNTs, and wherein the CNT-based capacitor is conductively coupled to the output terminals.

10. The method of claim 9, wherein the CNT-based FET is coupled to an input terminal via a fourth CNT conductor composed of CNTs, and wherein at least one of the input terminals is composed of CNTs mixed with a conductive material.

11. The method of claim 10, wherein the conductive material is copper.

12. The method of claim 9, wherein CNT-based FET has a source, a drain, and a gate, wherein the gate is composed of CNTs, and wherein the method further comprises applying a gate signal to the gate for controlling an amount of current that flows between the source and the drain via the gate.

13. The method of claim 9, wherein CNT-based inductor comprises a substrate having a spiraled trench, and wherein the coil is formed in the spiraled trench.

14. The method of claim 9, wherein the plurality of conductors of the CNT-based capacitor includes a first conductor having first CNT fingers composed of CNTs, wherein the plurality of conductors of the CNT-based capacitor includes a second conductor having second CNT fingers composed of CNTs, and wherein at least one of the first CNT fingers is positioned between a pair of the second CNT fingers.

* * * * *